United States Patent
Mizushima et al.

(10) Patent No.: US 8,711,666 B2
(45) Date of Patent: Apr. 29, 2014

(54) ADHESIVE STRUCTURE OF OPTICAL DEVICE, ADHESION METHOD, AND OPTICAL PICKUP DEVICE

(71) Applicant: Hitachi Media Electronics Co., Ltd., Oshu (JP)

(72) Inventors: Akiko Mizushima, Yokohama (JP); Hiroaki Furuichi, Kawasaki (JP); Kazuhiko Ito, Yokohama (JP); Ryuichiro Mizuno, Fujisawa (JP); Tamotsu Nishida, Yokohama (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 0 days.

(21) Appl. No.: 13/920,227

(22) Filed: Jun. 18, 2013

(65) Prior Publication Data

US 2014/0022880 A1   Jan. 23, 2014

(30) Foreign Application Priority Data

Jun. 19, 2012 (JP) ................................. 2012-137609

(51) Int. Cl.
*G11B 7/00* (2006.01)

(52) U.S. Cl.
USPC .................................... 369/112.01; 156/275.7

(58) Field of Classification Search
None
See application file for complete search history.

(56) References Cited

U.S. PATENT DOCUMENTS

2009/0251800 A1 * 10/2009 Iwai .............................. 359/704
2010/0212825 A1 * 8/2010 Hasegawa .................. 156/275.5

FOREIGN PATENT DOCUMENTS

JP   2007-226922   9/2007
JP   2009-146523   7/2009

* cited by examiner

*Primary Examiner* — Paul Huber (74) *Attorney, Agent, or Firm* — Antonelli, Terry, Stout & Kraus, LLP.

(57) ABSTRACT

In an optical pickup device for use in recording and reproducing on an optical recording medium, such as a CD or DVD, banks are formed on both sides of an adhesive agent application position for adhering an optical device, such as a photodetector or a laser diode, in an optical pickup case. At this time, a bank on the side of an optical path is formed higher than a height of an outer bank, and an adhesive agent is poured between the banks, to adhere the optical pickup case and the optical device.

9 Claims, 8 Drawing Sheets

ADHESIVE STRUCTURE OF OPTICAL DEVICE, ADHESION METHOD, AND OPTICAL PICKUP DEVICE

CLAIM OF PRIORITY

The present application claims priority from Japanese application serial no. JP2012-137609, filed on Jun. 19, 2012, the content of which is hereby incorporated by reference into this application.

BACKGROUND OF THE INVENTION

1. Field of the Invention

The present invention relates to an optical pickup device for use in recording/reproducing on an optical recording medium, such as a CD (Compact Disk), a DVD (digital Versatile Disk), a Blu-ray Disk (registered trademark), and, more particularly, to an adhesive fixing technique for a laser diode or a photodetector, etc.

2. Description of the Related Art

Figure 13A:
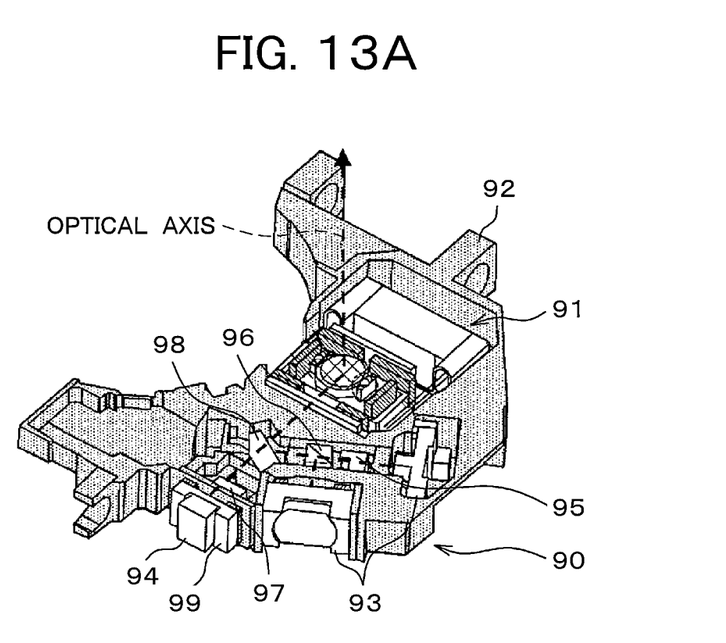
FIG. 13A is a block diagram of an optical pickup device according to the present invention.
Figure 13B:
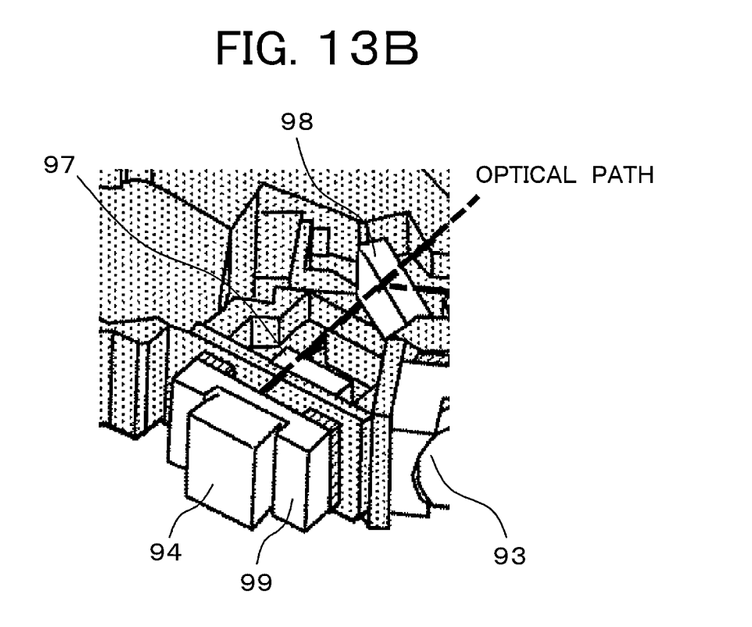
FIG. 13B is a diagram showing an example of an adhesive joint of a photodetector (optical device) thereof.

There are some types of optical systems as an optical pickup device for use in recording/reproducing on an optical recording medium (CD, DVD) and an optical disk drive device in which the optical pickup device is embedded. As illustrated in FIG. 13, one optical system leads output light from a light emitter 93 (laser diode (hereinafter referred to as an LD)) to an object lens through any of a lens 95, a prism 96, and a mirror 98, and converges the light onto an optical disk. Another optical system causes light reflected from the optical disk to be focused on a photodetector 94 through an object lens, a reflection mirror, a prism, and a lens 97. In these devices, the LD 93 and the photodetector 94 need to be fixed in an optically appropriately adjusted position with respect to a case 90 of the optical pickup device. Thus, generally, in the structure, the optical device (LD and photodetector 94) is once adhered to a holder 99 having a form suitable for adhering to the case. After the holder 99 and the case 90 are adjusted into an optically appropriate position, they are fixed in an appropriately three-dimensional position with the thickness of the adhesive agent layer, using a ultraviolet (UV) cure adhesive agent.

Variations of application positions, forms, and areas of the adhesive agent cause a variation in the adhesive strengths. In recent years, in some type of device, the case for installing the optical parts is made from a resin. This type of device is increasing. The resin case has a lower adhesive strength with the installed parts, than the adhesive strength of a metal case, and is likely to be separated at the interface. Thus, it is desired to improve the adhesive strength. Further, when an increased amount of adhesive agent is applied for the purpose of improving the adhesive agent, conventionally, a problem is that the adhesive agent may undesirably block the optical path.

Patent documents 1 and 2 are provided to disclose an optical pickup device, as prior art documents.

PRIOR ART DOCUMENTS

Patent Documents

Patent document 1: Japanese Unexamined Patent Application Publication No. 2007-226922
Patent document 2: Japanese Unexamined Patent Application Publication No. 2009-146523

In the above-described conventional techniques, Patent document 1 disclose a structure in which a through hole is formed in the adhered part, and a support is formed in the case, for the purpose of suppressing the separation of joint members and deviation of an optical axis. If the adhesive agent is applied into the through hole, it is difficult to define the amount of adhesive agent, resulting in a variation of the agent applications. Therefore, it is difficult to suppress the variation in the adhesive strength.

Patent document 2 proposes a structure in which the adhesive agent is applied into a concave groove formed in the case. However, it is difficult to control the adhesive agent overflowed from the groove, and it can be expected that the adhered areas may vary. Further, when the adhesive agent overflows onto the optical path, the optical path may undesirably be blocked.

The above-described techniques satisfy the capability of the present optical pickup device. However, the variation in the adhesive strength and the strength itself may undesirably and increasingly have an effect on the device, as the device is made thin and the adhered area is made small, from this time.

SUMMARY OF THE INVENTION

In order to solve the above problem, it is accordingly an object of the present invention to provide an optical pickup device which can suppress a variation in adhesive strengths, and can sufficiently attain the adhesive strength by increasing the adhered area on the side of the case, by defining the application positions, forms, and areas of the adhesive agent.

In order to solve the above problem, according to the present invention, there is provided an adhesive structure of an optical device, comprising: a case which has an adhesive joint to adhere the optical device; an optical device which is held by a holder and adjusted in accordance with relative positioning with the case so that an adhesive joint is opposed to the adhesive joint of the case to which an adhesive agent is applied and optically optimum sensitivity is attained for light passing through an optical path connected to the case; and an adhesive agent which is provided between the adhesive joint of the case and the adhesive joint of the optical device held by the holder, and which is formed by pressing into a predetermined thickness and hardened by ultraviolet rays, and wherein a plurality of pairs of banks are formed in positions between which an adhesive agent application area of the adhesive joint of the case is formed, and a height of a bank on a side of an optical path is higher than a height of other bank, in the plurality of banks, and the adhesive agent which is pressured in accordance with a relative positioning operation of the case and the optical device held by the holder is hardened in a state where it overflows over the other bank and is spread between the both adhesive joints.

According to the present invention, the adhesive strength can be stabilized by forming banks with different heights on the right and left sides of an adhesive agent application position of a case, and defining the application positions, forms, and areas of the adhesive agent. In addition, the adhesive strength can be improved by increasing the adhered area. Further, the projected part on the side of the optical path is formed to have a high height, thereby providing an optical pickup device which can suppress overflowing of the adhesive agent to the optical path.

DETAILED DESCRIPTION OF THE PREFERRED EMBODIMENTS

Preferred embodiments of the present invention will now specifically be described using the drawings.

First Embodiment

The first embodiment will now be described using any one of FIGS. 1A-1D to FIGS. 3A-3B. In the drawings, the same constituent elements are identified by the same reference numerals.

FIGS. 2A-2D are schematic diagrams showing an example of an adhesive process and a fixed structure, when connecting an optical pickup case 1 (90 in FIG. 13) introduced in a manufacturing process of a conventional optical pickup device and a photodetector 3 (94 in FIG. 13) which is held by a holder 2 (99 in FIG. 13).

Figure 2A:
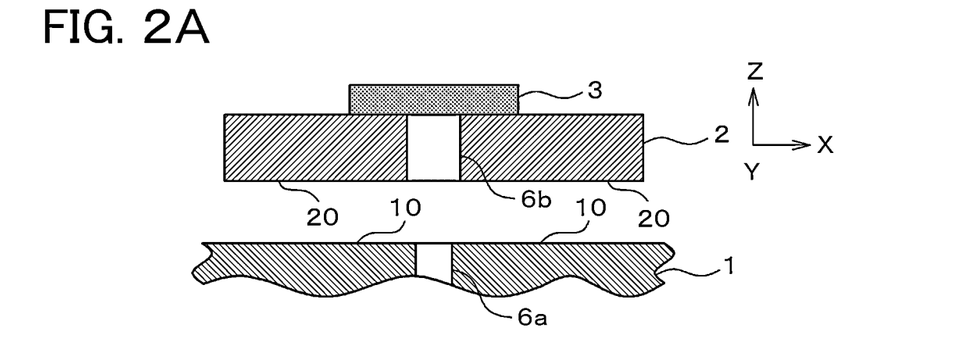
FIGS. 2A-2D are adhesive process schematic diagrams illustrating an example of an adhesive joint of a conventional optical pickup case and a photodetector.

As illustrated in FIG. 2A, a flat adhesive joint 10 of the optical pickup case 1 and an adhesive joint 20 on the side of the photodetector 3 held by the holder 2 are opposed to each other so as to be set. In this case, the optical pickup case 1 is fixed with a fixing jig (not illustrated) to achieve flatness of the adhesive joint 10. The photodetector 3 held by the holder 2 is kept by a keeping jig (not illustrated). The adhesive joint 20 (back surface of the holder 2) on the side of the photodetector is set in a position opposed to the above adhesive joint 10.

Figure 2B:
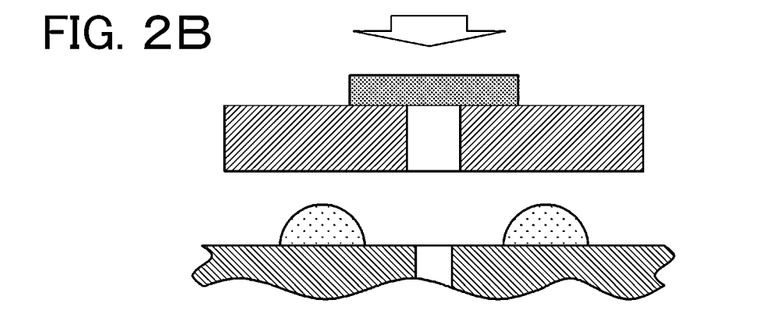

As illustrated in FIG. 2B, an adhesive agent 4 is applied to the adhesive joint 10 of the optical pickup case 1 fixed with the fixing jig, using a dispenser.

Figure 2C:
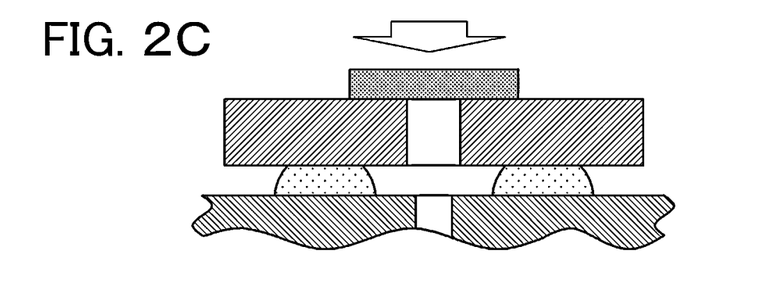

After the adhesive agent 4 is applied, as illustrated in FIG. 2C, the photodetector 3 held by the holder 2 is brought in proximity within a predetermined distance of the optical pickup case 1, for optically optimum alignment. Specifically, light emitted from an LD is received by the photodetector 3, through cylindrical optical paths formed in the optical pickup case 1 and the holder 2. In addition, to acquire the maximum sensitivity, the optical pickup case 1 and the photodetector 3 held by the holder 2 are positioned, and their inclination angles are adjusted, in accordance with a relative operation of the fixing jig for fixing the optical pickup case 1 and the keeping jig for keeping the photodetector 3 held by the holder 2. Then, the adhesive joint 10 of the optical pickup case 1 and the adhesive joint 20 on the side of the photodetector are positioned, in a range of a predetermined design distance.

By implementing this position alignment, a space of approximately 0.3 to 0.7 mm is made in the adhesive joint 20 on the side of the photodetector 3 opposed to the adhesive joint 10 of the optical pickup case 1. At the same time, the adhesive agent 4 applied to the adhesive joint 10 of the optical pickup case 1 is in contact with the opposed adhesive joint 20 on the side of the photodetector 3, and is spread on the surface thereof.

Figure 2D:
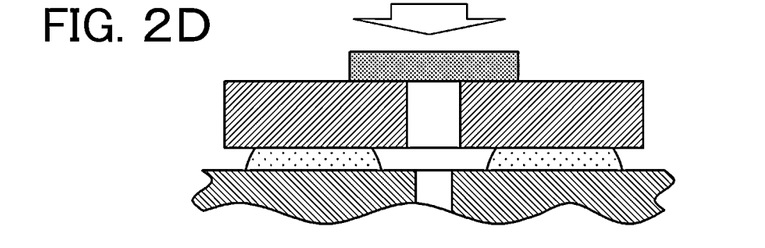

As illustrated in FIG. 2D, after the alignment, ultraviolet rays are irradiated onto the adhesive agent 4 so as to be hardened by a ultraviolet irradiator from the side surface direction of the adhesive agent 4 between the both adhesive joints. This results in completing a process for fixing the adhesive joint 10 of the optical pickup case 1 and the adhesive joint 20 of the photodetector 3 held by the holder 2, using the adhesive agent 4.

The applied adhesive agents may vary in their applied positions, forms, and areas, due to viscosity change of the adhesive agent in accordance with a change in the work environment (temperature, humidity, etc.) or due to the position alignment at the adhesion. What is concerned is that these variations may cause a variation in the adhesive strengths. In these days, there is a tendency of increasing the use of products including a resin as a material for the optical pickup case. It is difficult to maintain the adhesive strength of the resin optical pickup case. Therefore, it is desired to improve the strength.

Figure 1A:
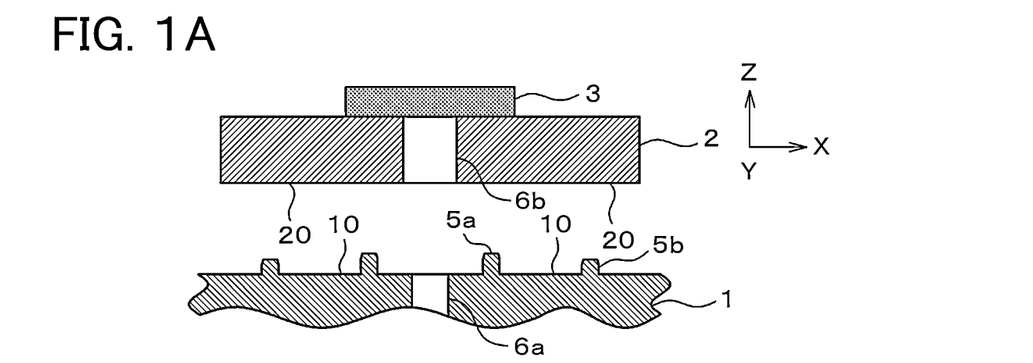
FIGS. 1A-1D are adhesive process schematic diagrams each illustrating an example of an adhesive joint of an optical pickup case according to a first embodiment of the present invention and a photodetector.
Figure 1B:
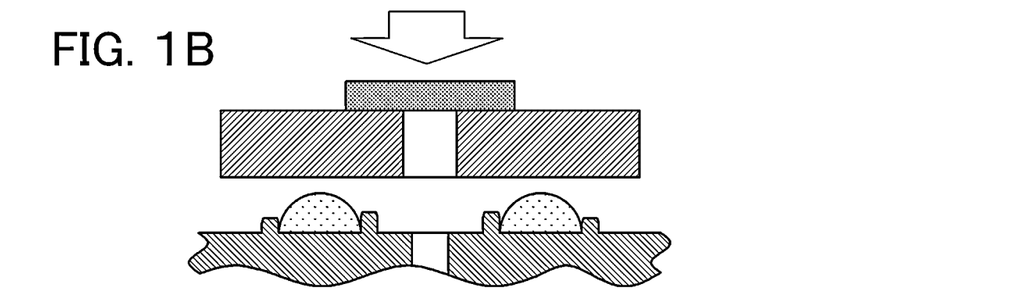
Figure 1C:
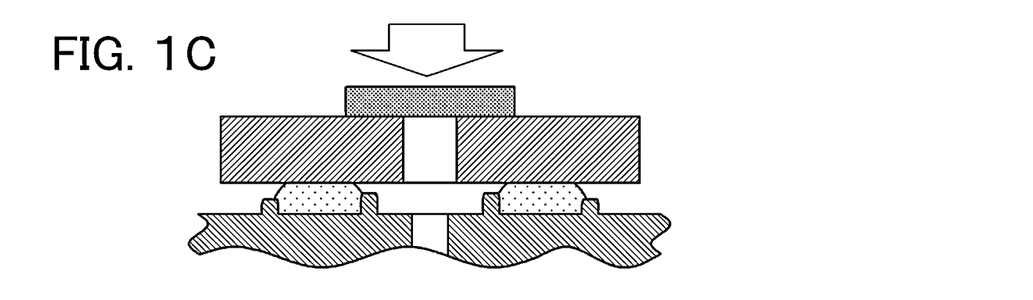

FIGS. 1A-1D and FIGS. 3A-3B are schematic diagrams each showing an example of an adhesive process and a fixed structure, when different height banks 5 of two rows are provided on both sides of the optical path 6a of the adhesive joint 10 of the optical pickup case 1 according to the first embodiment 1 of the present invention. In this embodiment, as illustrated in FIG. 1A, banks 5a on the side of the optical path 6a of the adhesive joint 20 on the side of the photodetector 3 have a higher height than the other banks 5b on the outer side. Because the banks 5 are provided, the adhesive agent 4 is applied (see FIG. 1B) and controlled its spread position, form, and area (see FIG. 1C), thus enabling to suppress the variation in the adhesive strengths and also improving the adhesive strength due to the increased adhered area.

In the structure where the height of the outer banks 5b is lower than banks 5a on the side of the optical path, any excess adhesive agent 4 overflowing at the alignment of the optical pickup case 1 and the photodetector 3 is actively overflowed from the outer banks 5b. Thus, the adhesive agent is hardly overflowed from the banks 5a on the side of the optical path, thus preventing the adhesive agent 5 from overflowing to the optical path 6a (see FIG. 1D).

Figure 1D:
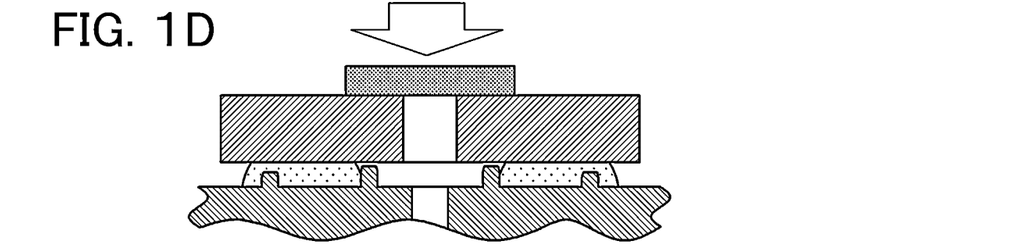
Figure 3A:
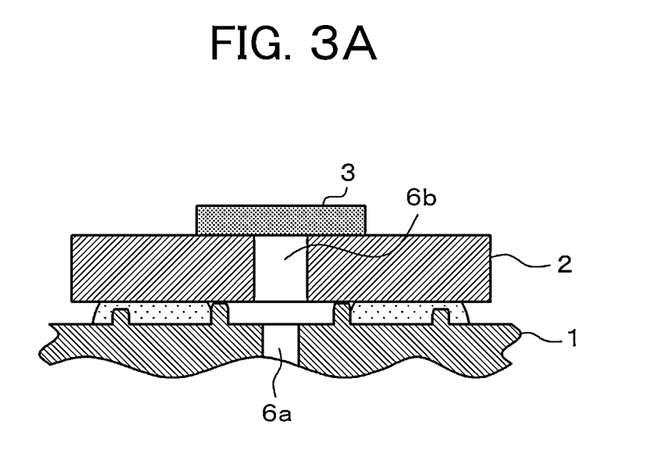
FIG. 3A is a cross sectional view of the adhesive joint of the optical pickup case of the first embodiment of the present invention and the photodetector.
Figure 3B:
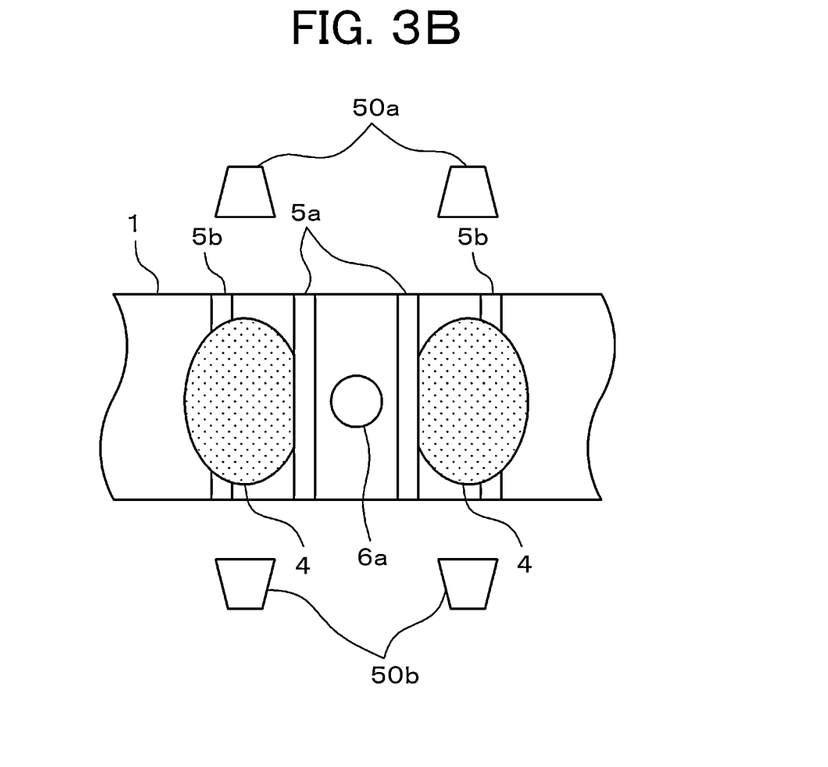
FIG. 3B is a cross sectional view showing an example of the adhesive joint on the upper surface of the optical pickup case, excluding a photodetector held by a holder from the corresponding structure.

FIG. 3A is a cross sectional view showing a structure in which the photodetector is adhered and fixed to the optical pickup case 1, like the structure of FIG. 1D. FIG. 3B is a cross sectional view of an adhesive joint on the upper surface of the optical pickup case 1, excluding the photodetector 3 held by the holder 2 from the structure. FIG. 3B is a cross sectional view showing a squeezed adhesive agent, and shows the upper surface of the banks 5a and 5b. In this embodiment, the banks 5a and 5b are freely provided, because there is no bank to prevent the adhesive agent from overflowing in a vertical direction in the illustration. This is based on an intention not to interrupt irradiation of the ultraviolet rays from ultraviolet irradiators 50a and 50b from both sides of the adhesive joint.

The adhesive agent 4 overflows in accordance with the height of the lower bank, so as to increase the adhered area.

As to the specific heights of the banks 5a and 5b, the higher bank 5a on the side of the optical path cannot be made higher than 0.3 mm, for example, when a space of approximately from 0.3 to 0.7 mm is made between the adhesive joint 10 of the optical pickup case 1 and the opposed adhesive joint 20 on the side of the photodetector 3. In this case, the height of the higher bank 5a on the side of the optical path is preferably equal to or lower than 0.3 mm (lower limit value of the space between the adhesive joint 10 of the optical pickup case 1 and the opposed adhesive joint 20 on the side of the photodetector 3), and the height of the outer lower bank 5b is preferably lower than the height of the higher bank 5a on the side of the optical path. It is preferred that the height of the outer lower bank 5b is optimized based on the predicted overflowing amount of the adhesive agent 4 at the alignment.

When there is a wide space between the adhesive joint 10 of the optical pickup case 1 and the opposed adhesive joint 20 on the side of the photodetector 3, the height of the higher bank 5a on the side of the optical path is preferably optimized to be equal to or lower than the lower limit value of the adhesive space, and the height of the outer lower bank 5b is preferably optimized to be lower than the height of the higher bank 5a on the side of the optical path. The banks 5a and 5b may be formed simultaneously when forming the optical pickup case 1 using a metal mold.

Second Embodiment

A second embodiment of the present invention will now be described using FIG. 4. Those matters described in the first embodiment but not described in the second embodiments are applicable to this embodiment, unless there are special circumstances.

Figure 4:
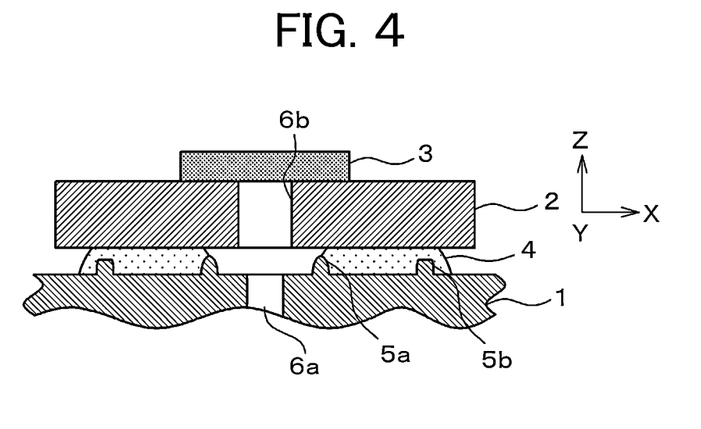
FIG. 4 is a schematic cross sectional view showing an example of an adhesive joint of an optical pickup case according to the second embodiment of the present invention and a photodetector.

FIG. 4 is a schematic diagram showing another example of a fixed structure in which the banks 5a and 5b with different heights are provided on both sides of the optical path 6a of the adhesive joint 10 of the optical pickup case 1 according to this embodiment. In this example, the basic structure is the same as that of FIG. 1D, but the top of the higher bank 5a on the side of the optical path is made in a projected form in cross section. In this structure, the same effects as that of the first embodiment can be obtained. In addition, the volume of the adhesive agent 4 between the banks 5a and 5b increases. Thus, it is possible to prevent the adhesive agent 4 from overflowing to the optical path 6a.

Third Embodiment

A third embodiment of the present invention will now be described with reference to FIG. 5. Those matters described in the first embodiment but not described in this embodiment are applicable to this embodiment also, unless there are special circumstances.

Figure 5:
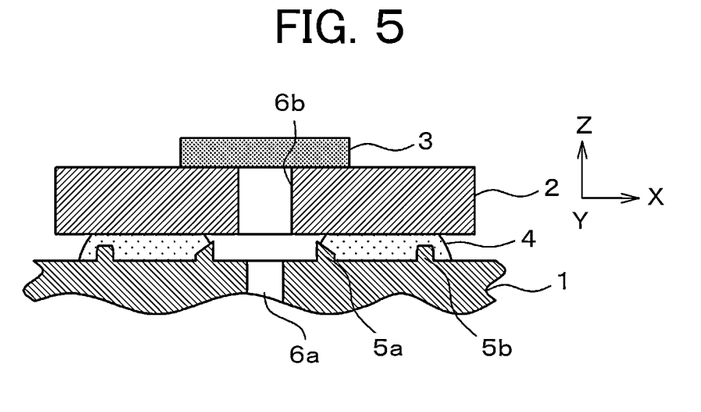
FIG. 5 is a schematic cross sectional view showing an example of an adhesive joint of an optical pickup case according to a third embodiment of the present invention and a photodetector.

FIG. 5 is a schematic diagram showing another example of a fixed structure in which the banks 5a and 5b with different heights are provided on both sides of the optical path 6a of the adhesive joint 10 of the optical pickup case 1 according to this embodiment. In this embodiment, the basic structure is the same as that of FIG. 4, but the top of the higher bank 5a on the side of the optical path is formed in an inversed taper. In the inversed taper, an end on the side of the optical path is higher than the outer end. In this structure, the same effect as that of the first embodiment can be obtained. In addition, it is possible to further prevent the adhesive agent 4 from overflowing to the optical path 6a for the same reason as that of the second embodiment.

Fourth Embodiment

A fourth embodiment of the present invention will now be described using FIG. 6. Those matters described in the first embodiment but not described in this embodiment are applicable to this embodiment also, unless there are special circumstances.

Figure 6:
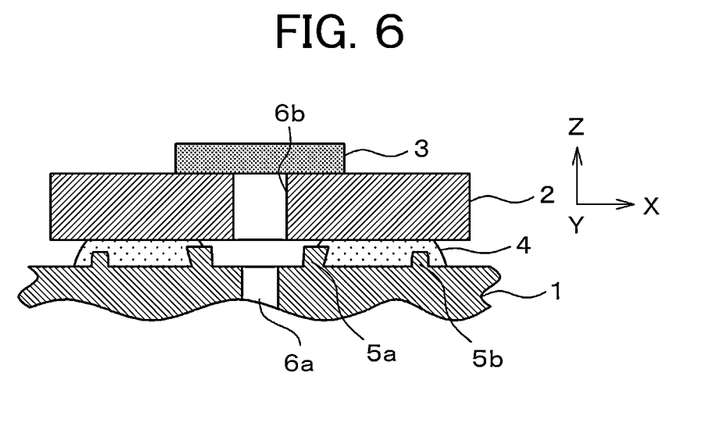
FIG. 6 is a schematic cross sectional view showing an example of an adhesive joint of an optical pickup case according to a fourth embodiment of the present invention and a photodetector.

FIG. 6 is a schematic diagram showing another example of a fixed structure in which the banks 5a and 5b with different heights are provided on both sides of the optical path 6a of the adhesive agent 4 of the optical pickup case 1 according to this embodiment. In this example, the basic structure is the same as that of FIG. 1D. However, a cross section of the higher bank 5a on the side of the optical path 6a is formed in an inversed taper. In the inversed taper, the outer side surface opposed to the optical path is outwardly inclined. In this structure, the same effect as that of the first embodiment can be obtained. In addition, it is possible to suppress the interface separation in a z-axis direction, when tensile stress is generated between the adhesive agent 4 and the optical pickup case 1.

Fifth Embodiment

Figure 8:
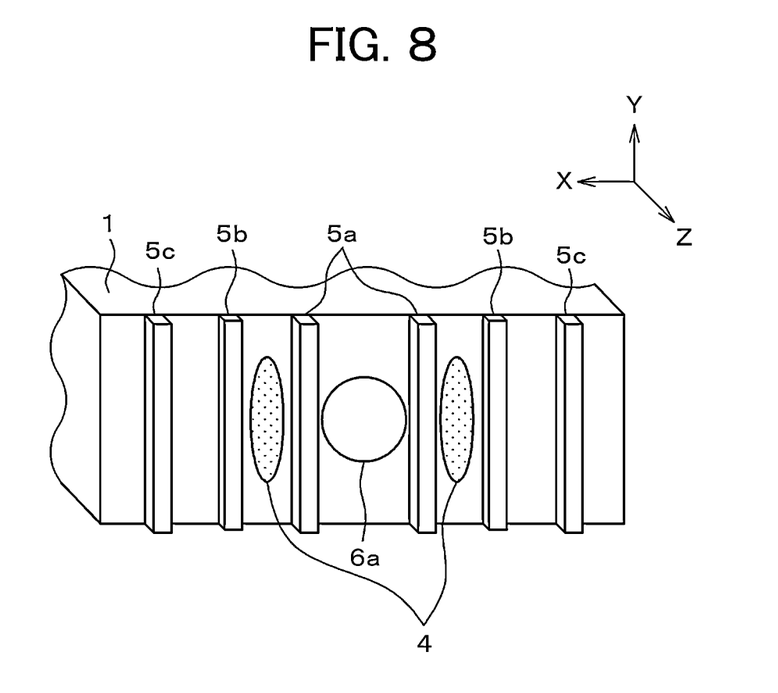
FIG. 8 is a perspective diagram showing an example, immediately after an adhesive agent is applied to the optical pickup case according to the fifth embodiment of the present invention.
Figure 9:
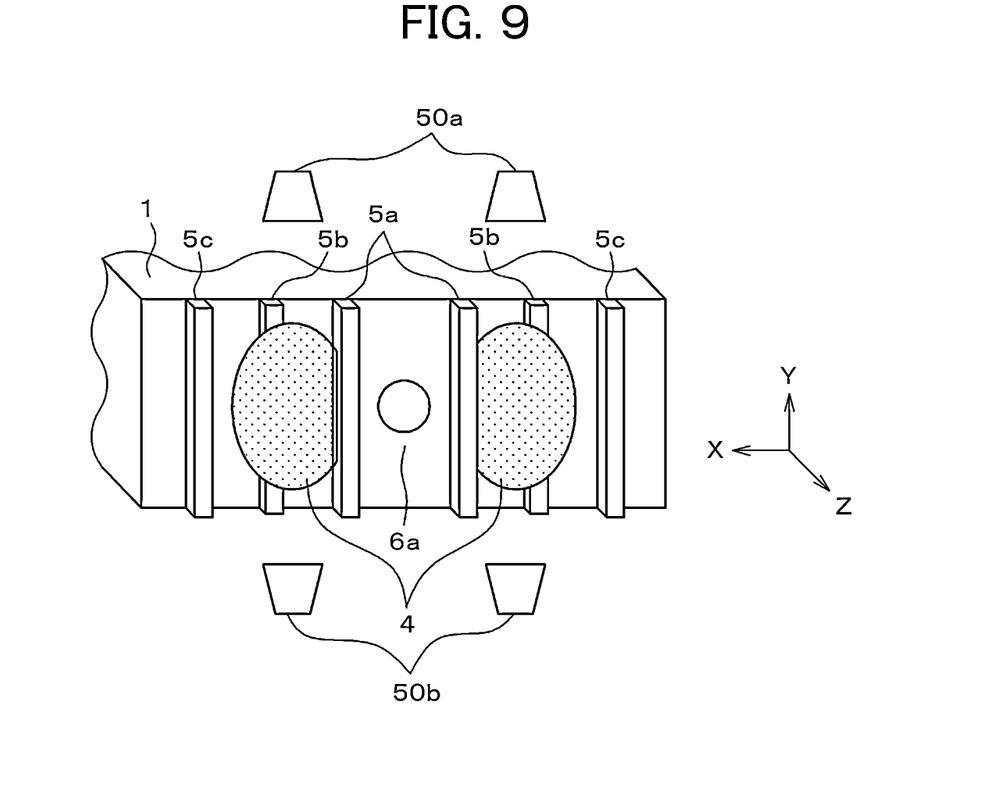
FIG. 9 is a perspective diagram of an adhesive joint of the optical pickup case after alignment, according to the fifth embodiment of the present invention.

A fifth embodiment of the present invention will now be described using FIG. 7 to FIG. 9. Those matters described in the first embodiment but not described in this embodiment are applicable to this embodiment, unless there are special circumstances.

Figure 7:
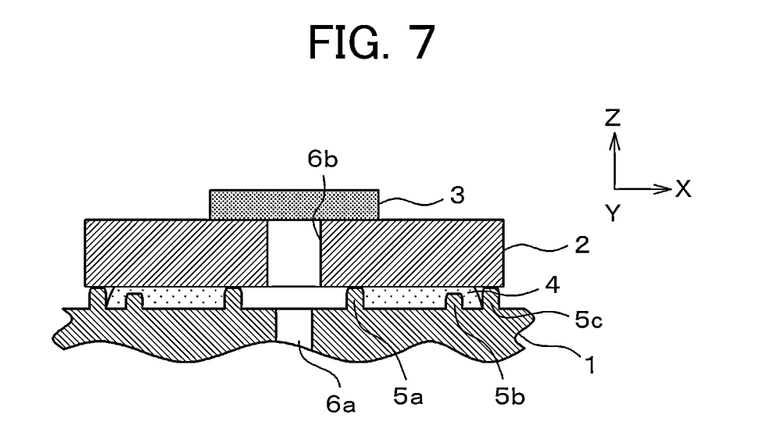
FIG. 7 is a schematic cross sectional view showing an example of an adhesive joint of an optical pickup case according to a fifth embodiment of the present invention and a photodetector.

FIG. 7 is a schematic diagram showing an example of a fixed structure in which the banks 5a and 5b with different heights are provided on both sides of the optical path 6a of the adhesive joint 10 of the optical pickup case 1 according to this embodiment. FIG. 8 shows a state of the adhesive joint 10 of the optical pickup case 1 to which the adhesive agent 4 is applied, before the alignment of the photodetector 3. FIG. 9 is a diagram showing a state of the adhesive joint 10 of the optical pickup case 1, after the alignment of the photodetector 3.

In this example, the basic structure is the same as that of FIG. 1D, but a third bank 5c is formed outwardly of the outer lower bank 5b. In this structure, when the optical pickup case 1 and the photodetector 3 are aligned, it is possible to control the adhered area by blocking the adhesive agent 4 which has overflowed over the outer lower bank 5*b*, using the third bank 5*c*, and it is also possible to suppress the variation in the adhesive strengths. Thus, the adhesive strengths can expectedly be improved due to an increase in the adhered area. Further, with the third bank 5*c*, it is possible to increase the amount of adhesive agent 4, thus attaining the effect of the improved adhesive strengths.

The higher bank 5*a* on the side of the optical path in the fifth embodiment may be formed in any form of the above-described first to fourth embodiments.

Sixth Embodiment

Figure 11:
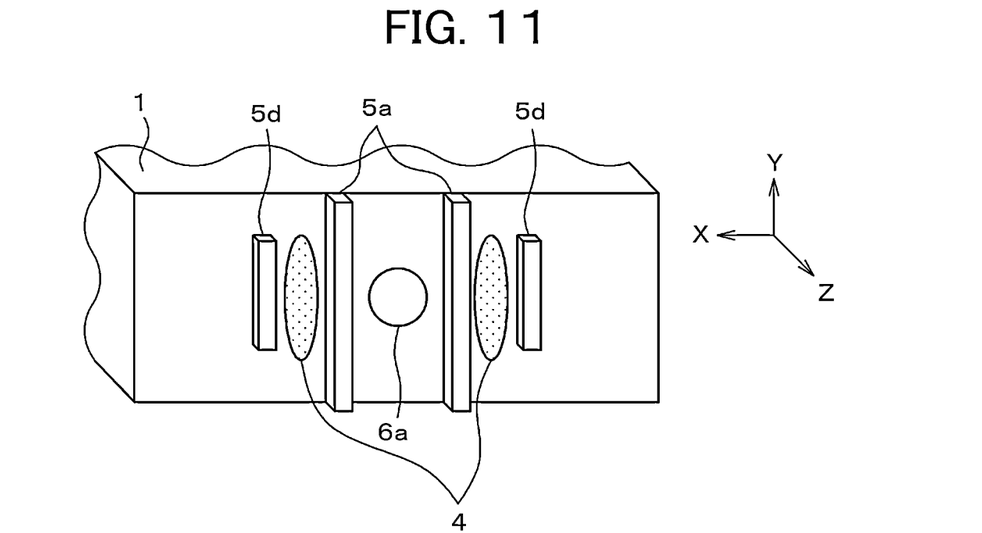
FIG. 11 is a perspective diagram showing an example, immediate after an adhesive agent is applied to the optical pickup case according to the sixth embodiment of the present invention.
Figure 12:
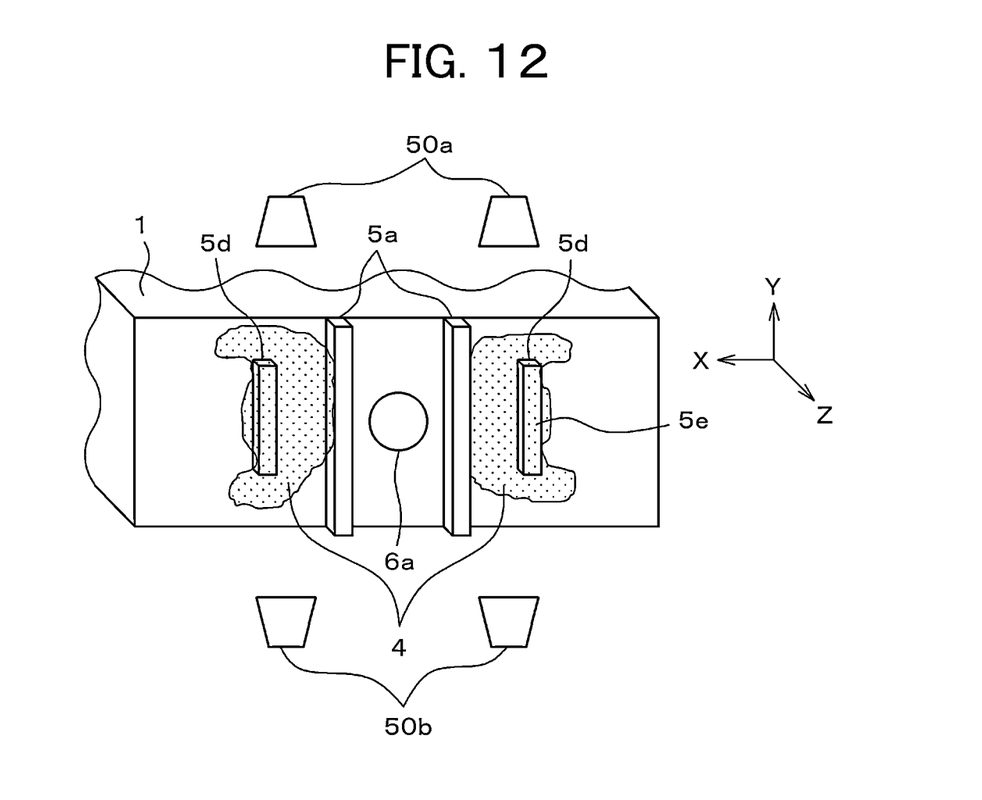
FIG. 12 is a perspective diagram of an adhesive joint of the optical pickup case after alignment, according to the sixth embodiment of the present invention.

A sixth embodiment of the present invention will now be described using FIG. 10 to FIG. 12. Those matters described in the first embodiment but not described in this embodiment are also applicable to this embodiment, unless there special circumstances.

Figure 10:
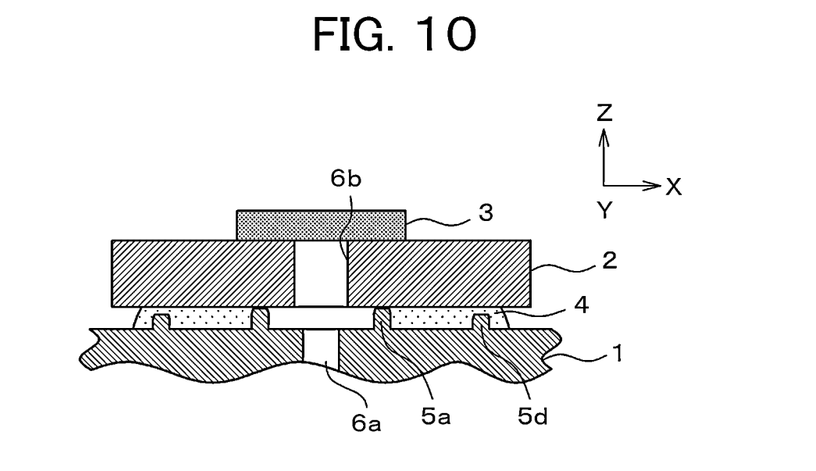
FIG. 10 is a schematic cross sectional view showing an example of an adhesive joint of an optical pickup case according to a sixth embodiment of the present invention and a photodetector.

FIG. 10 is a schematic diagram showing another example of a fixed structure, in which the banks 5 with different heights are provided on both sides of the optical path 6*a* of the adhesive joint 10 of the optical pickup case 1 according to this embodiment. FIG. 11 shows a state of the adhesive joint 10 of the optical pickup case 1 to which the adhesive agent 4 is applied, before the alignment of the photodetector 3. FIG. 12 shows a state of the adhesive joint 10 of the optical pickup case 1, after the alignment of the photodetector 3.

In this example, the basic structure is the same as that of FIG. 1D, but the length of an outer lower bank 5*d* is shorter than the length of the higher bank 5*a* on the side of the optical path. This outer lower bank 5*d* can positively cause the adhesive agent 4 (which has overflowed at the alignment of the optical pickup case 1 and the photodetector 3) to be released from the both ends, and can enhance an anti-overflowing effect on the adhesive agent 4 to the optical path 6*a*. Further, the adhesive agent 4 can positively be released from both ends of the shorter bank 5*d*, thus enabling to decrease the amount of adhesive agent 4 overflowing over a bank center part 5*e*.

The adhesive agent 4 after the alignment of the photodetector 3 can be hardened by irradiating ultraviolet rays using a UV lamp from both directions of the both sides of a space of approximately from 0.3 to 0.7 mm. This space is made between the adhesive joint 10 of the optical pickup case 1 and the opposed adhesive joint 20 on the side of the photodetector 3. At this time, the hardening reaction of the adhesive agent 4 begins from the surface of the adhesive agent 4 near ultraviolet irradiators 50*a* and 50*b*, and then gradually progresses toward the center part of the adhesive agent 4. The hardening reaction progresses while the adhesive agent 4 absorbs the irradiated ultraviolet rays. Thus, the amount of ultraviolet rays reaching the center part of the adhesive agent 4 is smaller than the amount of ultraviolet rays reaching the surface of the adhesive agent 4. As a result, when the hardening reaction unevenly progresses between the surface and the center part of the adhesive agent 4, it is well known that the shrinkage is unevenly generated at the hardening, thus resulting in a factor of optical deviation.

It is preferred that the surface and the center part of the adhesive agent 4 are evenly hardened. In the center part, in which a smaller amount of ultraviolet rays reach than an amount of ultraviolet rays reaching the circumferential part, the amount of remaining adhesive agent 4 is preferably small for the purpose of suppressing the optical deviation.

Therefore, by causing the adhesive agent 4 to positively be released from both sides of the shorter bank 5*d*, the amount of adhesive agent 4 remaining in the bank center part 5*e* can be reduced, thereby enabling to suppress the optical deviation of the photodetector 3.

The form of the higher bank 5*a* on the side of the optical path 6*a* in the sixth embodiment may be in any form described in the above-described embodiments, and may be configured in combination with the third bank 5*c* in the fifth embodiment.

The descriptions have been made to the optical pickup device according to the preferred embodiments of the present invention. However, the present invention is not limited to the above-described embodiments.

What is claimed is:

1. An adhesive structure of an optical device, comprising:
a case which has an adhesive joint to adhere the optical device;
an optical device which is held by a holder and adjusted in accordance with relative positioning with the case so that an adhesive joint is opposed to the adhesive joint of the case to which an adhesive agent is applied and optically optimum sensitivity is attained for light passing through an optical path connected to the case; and
an adhesive agent which is provided between the adhesive joint of the case and the adhesive joint of the optical device held by the holder, and which is formed by pressing into a predetermined thickness and hardened by ultraviolet rays, and
wherein a plurality of pairs of banks are formed in positions between which an adhesive agent application area of the adhesive joint of the case is formed, and a height of a bank on a side of an optical path is higher than a height of other bank, in each pair of banks, and
the adhesive agent which is pressured in accordance with a relative positioning operation of the case and the optical device held by the holder is hardened in a state where it overflows over the other bank and is spread between the both adhesive joints.

2. The adhesive structure of the optical device, according to claim 1,
wherein in the plurality of banks formed on the adhesive joint of the case, a cross section of a top of the bank on the side of the optical path is made in a projected form.

3. The adhesive structure of the optical device, according to claim 1,
wherein in the plurality of banks formed on the adhesive joint of the case, a top of the bank on the side of the optical path is formed in a taper in which an end on the side of the optical path is higher than an outer end.

4. The adhesive structure of the optical device, according to claim 1,
wherein in the plurality of banks formed on the adhesive joint of the case, a cross section of the bank on the side of the optical path is formed in a taper in which an outer side surface opposed to the side of the optical path is outwardly inclined.

5. The adhesive structure of the optical device, according to claim 1, further comprising:
a third bank for blocking the adhesive agent overflowed over the other bank formed with a lower height than that of the bank on the side of the optical path, in the plurality of pair of banks formed in positions between which the adhesive agent application area of the adhesive joint of the case is formed.

6. The adhesive structure of the optical device, according to claim 1,
wherein in the plurality of pairs of banks formed in positions between which the adhesive agent application area of the adhesive joint of the case is formed, a length of the other bank with a height lower than a height of the bank on the side of the optical path is made shorter than a length of the bank on the side of the optical path, the adhesive agent pressured in accordance with a relative positioning operation of the case and the optical device held by the holder overflows over the other bank and is spread between the both adhesive joints, and the adhesive agent is positively released from both ends of the other bank so as to be hardened.

7. The adhesive structure of the optical device according to claim 1,
wherein in the plurality of pairs of banks formed in positions between which the adhesive agent application area of the adhesive joint of the case is formed, the height of the bank on the side of the optical path is set equal to or lower than a lower limit value of a design thickness of the adhesive agent, the height of the other bank is set lower than the height of the bank on the side of the optical path and is optimized based on a predicted overflowing amount of the adhesive agent overflowing over the bank at the alignment of the both adhesive joints.

8. An optical pickup device comprising:
a light emitting device which emits light;
a photodetector which receives light;
an object lens; and
an optical pickup case which leads light emitted from the light emitting device to the object lens, and includes various optical parts for converging light onto an optical disk and various optical parts for causing light reflected from the optical disk to be focused on the photodetector, and
wherein a plurality of pairs of banks are formed in positions between which an adhesive agent application area is formed, on an adhesive joint for adhering the light emitting device or the photodetector of the optical pickup case, and in the plurality of banks, a height of a bank on a side of an optical path is higher than a height of other outer bank, and
the adhesive joint of the light emitting device or the photodetector held by a holder is opposed to an adhesive joint of the optical pickup case onto which an adhesive agent is applied, and the adhesive agent pressured in accordance with a relative positioning operation of the adhesive joint of the optical pickup case and the adhesive joint of the light emitting device or the photodetector held by the holder is hardened in a state where it overflows over the other outer bank and is spread between the both adhesive joints, to attain optically optimum sensitivity for light passing through an optical path connected to the case.

9. An adhesion method for an optical device, having the steps of causing an adhesive joint on a side of an optical device held by a holder to be opposed to an adhesive joint for adhering an optical device of a case, applying an adhesive agent onto the adhesive joint of the case, and, to attain optically optimum sensitivity for light passing through an optical path toward the optical device from the case, adjusting relative positioning of the case and the optical device held by the holder and hardening the adhesive agent between both of the adhesive joints, the method comprising the steps of:
forming a plurality of pairs of banks in which a height of a bank on the side of the optical path is higher than a height of other outer bank, in positions between which an adhesive agent application area of the adhesive joint of the case is formed, and
hardening the adhesive agent pressured in accordance with a relative positioning operation of the case and the optical device held by the holder, in a state where it overflows over the other outer bank and is spread between the both adhesive joints.

* * * * *